(12) United States Patent
Fang et al.

(10) Patent No.: US 7,029,975 B1
(45) Date of Patent: Apr. 18, 2006

(54) METHOD AND APPARATUS FOR ELIMINATING WORD LINE BENDING BY SOURCE SIDE IMPLANTATION

(75) Inventors: Shenqing Fang, Fremont, CA (US); Kuo-Tung Chang, Saratoga, CA (US); Pavel Fastenko, Sunnyvale, CA (US); Kazuhiro Mizutani, Sunnyvale, CA (US)

(73) Assignee: Advanced Mirco Devices, Inc., Sunnyvale, CA (US)

( * ) Notice: Subject to any disclaimer, the term of this patent is extended or adjusted under 35 U.S.C. 154(b) by 134 days.

(21) Appl. No.: 10/839,561

(22) Filed: May 4, 2004

(51) Int. Cl.
*H01L 21/336* (2006.01)

(52) U.S. Cl. ...................... 438/258; 438/286

(58) Field of Classification Search ................ 438/258, 438/286
See application file for complete search history.

(56) References Cited

U.S. PATENT DOCUMENTS

| 5,918,125 | A  | * | 6/1999 | Guo et al. ................... 438/264 |
| 6,265,292 | B1 | * | 7/2001 | Parat et al. ................. 438/524 |
| 6,518,618 | B1 | * | 2/2003 | Fazio et al. ................. 257/315 |

* cited by examiner

*Primary Examiner*—Chandra Chaudhari

(57) ABSTRACT

A method and apparatus for coupling to a source line is disclosed. A semiconductor structure having an array of memory cells arranged in rows and columns is described. The array of memory cells includes a source region that is implanted with n-type dopants isolated between an adjoining pair of the non-intersecting STI regions and isolated from a drain region during the implantation. A source contact is located along a row of drain contacts that are coupled to drain regions of a row of memory cells and the source contact is coupled to the source region for providing electrical coupling with a plurality of source lines. The isolating of the implanted source region from the drain region during the implanting enables coupling of the source contact to the source lines while maintaining the n-type dopants between the STI regions and avoiding lateral diffusion to a bit-line.

12 Claims, 16 Drawing Sheets

800D

METHOD AND APPARATUS FOR ELIMINATING WORD LINE BENDING BY SOURCE SIDE IMPLANTATION

TECHNICAL FIELD

The present invention relates to the field of semiconductor memory devices. Specifically, the present invention relates to a nonvolatile semiconductor memory device including a NOR type array of flash memory cells exhibiting straight word lines.

BACKGROUND ART

A flash or block erase memory (flash memory), such as Electrically Erasable Programmable Read-Only Memory (Flash EEPROM), includes an array of cells which can be independently programmed and read. The size of each cell, and thereby the memory as a whole, is made smaller by eliminating the independent nature of each of the cells. As such, all of the cells are erased together as a block.

A memory of this type includes individual Metal-Oxide Semiconductor (MOS) memory cells that are field effect transistors (FETs). Each FET, or flash memory cell, includes a source, drain, floating gate and control gate to which various voltages are applied to program the cell with a binary 1 or 0, or erase all of the cells as a block. Programming occurs by hot electron injection in order to program the floating gate. Erasure employs Fowler-Nordheim tunneling effects in which electrons pass through a thin dielectric layer, thereby reducing the amount of charge on the floating gate. Erasing a cell sets the logical value of the cell to "1," while programming a cell sets the logical value to "0." The flash memory cell provides for nonvolatile data storage.

Prior Art FIG. 1 illustrates a typical configuration of a plan view of a section of a memory array 100 in a NOR-type of configuration for a memory device. Prior Art FIG. 1 is not drawn to scale. As shown in Prior Art FIG. 1, the array 100 is comprised of rows 110 and columns 120 of memory cells. Each of the memory cells are isolated from other memory cells by insulating layers, e.g., a plurality of shallow trench isolation regions (STI) 150.

A plurality of word lines 130 extend along the row direction. Bit lines extend in the column direction and are coupled to drain regions via drain contacts 160 in an associated column of memory cells 120. The bit lines are coupled to drain regions of memory cells in associated columns of memory cells 120.

A plurality of source lines 140 extend in the row direction and are coupled to the source regions of each of the memory cells in the array of memory cells 100. One source line is coupled to source regions in adjoining rows of memory cells, and as a result, one source region is shared between two memory cells. Similarly, drain regions are shared among adjoining rows of memory cells, and as a result, one drain region is shared between two memory cells.

Each of a plurality of source contacts 145 is coupled to the plurality of common source lines 140. Each of the plurality of source contacts 145 is formed in line with the associated common source line to which it is coupled. The source contacts are formed in a column 147, and may be connected with each other. The column 147 is isolated between two STI regions and forms a zone in which no memory cells are present.

As shown in FIG. 1, due to current photolithography limitations in forming contacts, each of the plurality of source contacts 145 is larger than their associated common source lines 140. As a result, the common source lines 140 need to be widened in the region surrounding their associated source contacts 145. This is to accommodate the wider source contacts 145. As such, word lines 130 on either side of the common source line 140 are bent to accommodate the increased area for the common source line surrounding an associated source contact 145.

Column 147 is wider than columns 120 in order to accommodate the bending of word lines 130 and is difficult to be scaled down. That is, as the size of each memory cell, and correspondingly the array 100 itself, is reduced, the bending of the word lines to accommodate the size of the source contacts is limited by current photolithography and other process techniques. For example, as the size shrinks, it becomes more difficult to form a pronounced bend in each of the plurality of word lines 130 at current pitches achievable by current photolithography techniques. As a result, the size of the overall array 100 is limited by the ability to bend the word lines 130.

Furthermore, the inability to form straight word lines in the region surrounding the source contacts 145 effects the uniformity of cells throughout the array 100. Specifically, the memory cells bordering the column 147 of source contacts that includes the source contacts 145 may have electrical characteristics (erase and program) that are different from those memory cells that do not border a column of source contacts. Core cell natural voltage and erased threshold voltage are specific problems.

A prior art example that attempts to address this problem is shown in Prior Art FIGS. 1B and 1C. Prior Art FIG. 1B is a planar view 100B of a section of a core memory array of memory cells in which a stripe 185 is implanted by implanting the source and drain sides of memory cells along a column that aligns with the source regions. On each side of the column an STI (shallow trench isolation) region 150 will have been formed. The source contacts 180 are formed on the wider drain side and the contacts 180 are connected to the Vss line 140 via implant stripe 185. Prior Art FIG. 1C is a cross-sectional view 100C of the core memory array of memory cells of FIG. 1B. Dotted line 150 represents the bottom of STI region (e.g., 150 in FIGS. 1A and 1B). FIG. 1C illustrates a problem that may exist with this approach. If the STI 150 is shallow and the implant layer 185 diffuses deep when contacts are formed, if the implant layer is misaligned, or if the bit line spacing is scaled down, then the dopant may diffuse laterally (as shown by section 165 diffusing below STI 150) through to bit lines (120B and/or 120C of FIG. 1B) and short out the adjacent transistor circuitry (bit-line "punch through").

SUMMARY

Embodiments of the present invention provide a memory device with better uniformity between memory cells in an array of memory cells, leading to more compactness in the array of memory cells, and higher yields for the array. Also, the present invention provides for a method for forming word lines in an array of memory cells that is more easily fabricated using current photolithography techniques. Also, the present invention provides a method for avoiding lateral diffusion and bit-line "punch through".

Specifically, embodiments of the present invention disclose a memory device comprising an array of flash memory cells with a source line connection that facilitates straight word lines, and a method for producing the same. In the apparatus, an array is comprised of a plurality of non-intersecting shallow trench isolation (STI) regions that isolate a plurality of memory cell columns, in one embodiment. A plurality of source regions on the source side of the memory cells are implanted with n-type dopants and are also isolated between an adjoining pair of STI regions. As such, the array of memory cells is comprised of columns of memory cells and at least one column that contains the plurality of implanted source regions.

BRIEF DESCRIPTION OF THE DRAWINGS

The accompanying drawings, which are incorporated in and form a part of this specification, illustrate embodiments of the invention and, together with the description, serve to explain the principles of the invention. The drawings are not to scale.

PRIOR ART

PRIOR ART

PRIOR ART

DETAILED DESCRIPTION

Reference will now be made in detail to the preferred embodiments of the present invention, a semiconductor structure including a core memory array of memory cells with source line connections that eliminate word line bending by source side implantation, and a method for producing the same. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, the present invention discloses a memory device with better uniformity of performance between memory cells in an array of memory cells, more compactness in the array of memory cells, and higher yields for the array. Also, the present invention discloses a method for forming source line connections that facilitate easier fabrication of straight word lines in an array of memory cells using current photolithography techniques. In addition, by implanting only the source side of the cell where the source line connections are made, the drain side junction may remain sufficiently shallow to avoid lateral diffusion beneath the STI (shallow trench isolation) region and therefore to avoid bit line "punch through."

Figure 2:
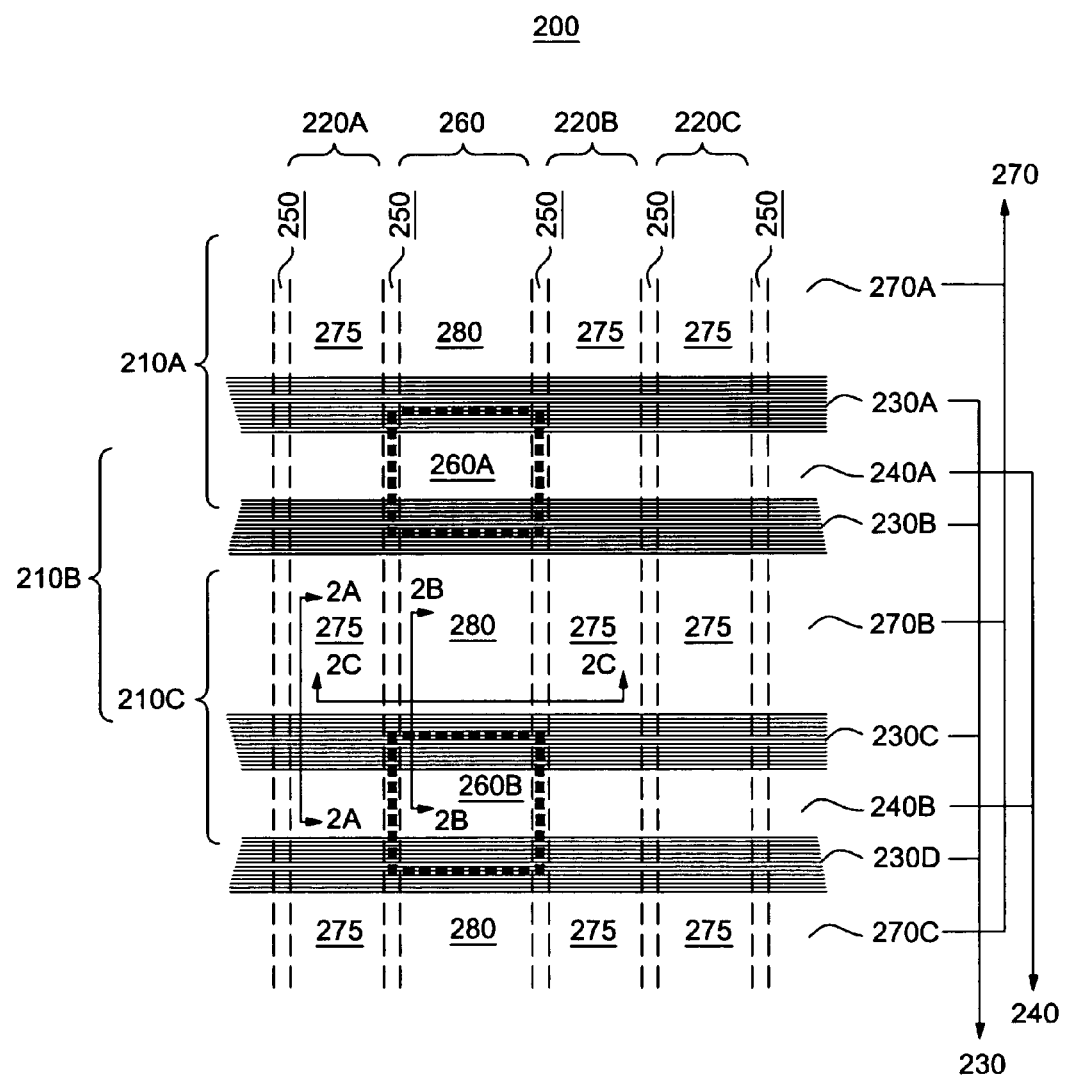
FIG. 2 is a planar view of a section of a core memory array of memory cells including a source column and showing the implant region through which the source contact is connected to the source column, in accordance with one embodiment of the present invention.

FIG. 2 is a planar view of a section of the core array of memory cells illustrating the formation of source line connections that facilitate the formation of straight word lines, in accordance with one embodiment of the present invention. As shown in FIG. 2, the array 200 comprises a plurality of rows 210 of memory cells (e.g., row 210A, 210B, 210C, etc.). The array 200 also comprises a plurality of columns 220 of memory cells (e.g., column 220A, 220B, 220C, etc.) corresponding to bit lines. Each of the memory cells are isolated from other memory cells by insulating layers. For example, a plurality of non-intersecting shallow trench isolation regions (STI) 250 isolate memory cells along the row direction. Column 260 is known as the source column, and corresponds to the column in which the source region contacts will be made.

The control gates of each of the memory cells in the array 200 are coupled together in each of the plurality of rows 210 of memory cells, and form a plurality of word lines 230 that extend along the row direction, in accordance with one embodiment of the present invention. The plurality of word lines comprises word lines 230A, 230B, 230C, 230D, etc.

Bit lines (not shown) extend in the column direction and are coupled to drain regions of associated memory cells via a plurality of drain contacts 275 in associated columns of memory cells 220. As such, each of the bit lines is coupled to drain regions of memory cells in associated columns of memory cells 220.

A plurality of source lines 240 extend along the row direction and are coupled to source regions in each of the memory cells in the array of memory cells 200. The plurality of source lines 240 are comprised of source lines 240A, 240B, etc. as shown in FIG. 2. The source lines 240 are also referred to as $V_{ss}$ lines in some circles. In one embodiment, the plurality of source lines 140 is a plurality of common source lines. As such, the common source lines in the plurality of common source lines 140 are electrically coupled together.

In addition, one common source line is coupled to source regions in adjoining rows of memory cells, and as a result, one source region is shared between two memory cells. Similarly, drain regions are shared amongst adjoining rows of memory cells, and as a result, one drain region is shared between two memory cells in the column direction.

Also, as shown in FIG. 2, each of the rows of memory cells 210 has an associated row of drain contacts 270 in the plurality of rows of drain contacts comprised of rows 270A, 270B, etc. For example, row 210A is associated with the row 270A of drain contacts. Within the fabrication process, each of the drain contacts 275 are formed similarly and simultaneously to couple with the underlying drain regions of each of the memory cells in the array 200.

FIG. 2 is exemplary only, and the pattern of word lines, source lines, and bit lines can be altered for performance reasons. For example, each of the plurality of source lines 240 of FIG. 2 is a common source line, but could easily be formed as an unshared source line. In addition, the pattern of word lines, source lines, and bit lines coupled to the array of memory cells 200 is shown in a NOR type configuration. However, other embodiments are well suited to arrays of other logical configurations.

Importantly, FIG. 2 illustrates the formation of implants at source regions 260A and 260B, located in source column 260, for providing electrical coupling to the source regions of each of the memory cells in the array 200, in accordance with one embodiment of the present invention. The source regions 260A and 260B are masked so as to isolate them from the drain regions and then implanted with n-type dopants to connect them with the source or Vss lines 240. Typical n-type dopants can be taken from a group consisting of arsenic, phosphorous, and antimony in one embodiment; however, other embodiments are well suited to any n-type dopants suitable for fabrication of core array of memory cells.

The source regions 260A and 260B are also isolated between an adjoining pair of the plurality of non-intersecting STI regions 250. As such, the source regions 260A and 260B are electrically isolated from adjoining memory cells on either side of the adjoining pair of STI regions. The implants at source regions 260A and 260B are also permanently coupled to a plurality of common source lines 240. Following the formation of the implants at source regions 260A and 260B, a thermal anneal cycle is performed to diffuse the implants under adjacent stacked gates that are located along word lines 230.

In addition, FIG. 2 illustrates the formation of a source contact region 280 that is coupled to the implants at source regions 260A and 260B by the thermal anneal cycle mentioned above. The source contact 280 provides for electrical connection to each of the plurality of source regions in memory cells of the array 200 through the source column and, thus, the plurality of common source lines 240.

In one embodiment, the source contact region 280 is located along one of the plurality of rows 270 of drain contact regions (e.g., row 270A of drain contacts). A source contact at region 280 is formed separately in the fabrication process from the formation of the plurality of drain contacts at drain contact regions 275 in the row 270A of drain contact regions. In one embodiment, the source contact region 280 is shallower than the implants at source regions 260A and 260B. The source contact region 280 provides for electrical coupling to the implant at source region 260A. By virtue of the fact that there is another drain side implant (DSI) at a later process step that produces a much shallower junction in the drain side under source contact 280, the formation of an electrical connection remains shallower than the implants at source regions 260A and 260B and shallower than the STI regions 150, thus avoiding lateral diffusion that might allow "punch through" to the bit lines under columns 220A and 220B, which in turn might short out the memory cells aligned with columns 220A and/or 220B.

The location of the source contact 280 along the row of drain contacts 270 enables the straight formation of a word line (e.g., 230A) that intersects the column containing the source region implants 260 near to the source contact 280. Instead of forming the source contact 280 in line with an associated $V_{ss}$ line (e.g., 240A) from the plurality of common source lines 240, the source contact is moved and formed along one of the plurality of rows of drain contact regions 275 (e.g., row 270A). The drain contact regions 275 in each of the rows of memory cells 210 are arranged perpendicularly to the source column 260.

Since there is more space allowed to form the source contact at source contact regions (e.g., 280) along the row of drain contacts 270A than in one of the plurality of common source lines 240, each of the plurality of word lines 230 does not need to be adjusted, or bent, through photolithography techniques in order to accommodate for the source contact 280. As such, the word lines (e.g., word line 230A) that intersect the column containing source regions 260A and 260B on either side of the row of drain contact regions 270A that includes the source contact region 280 will maintain a uniform and straight formation in the fabrication process.

Figure 1A:
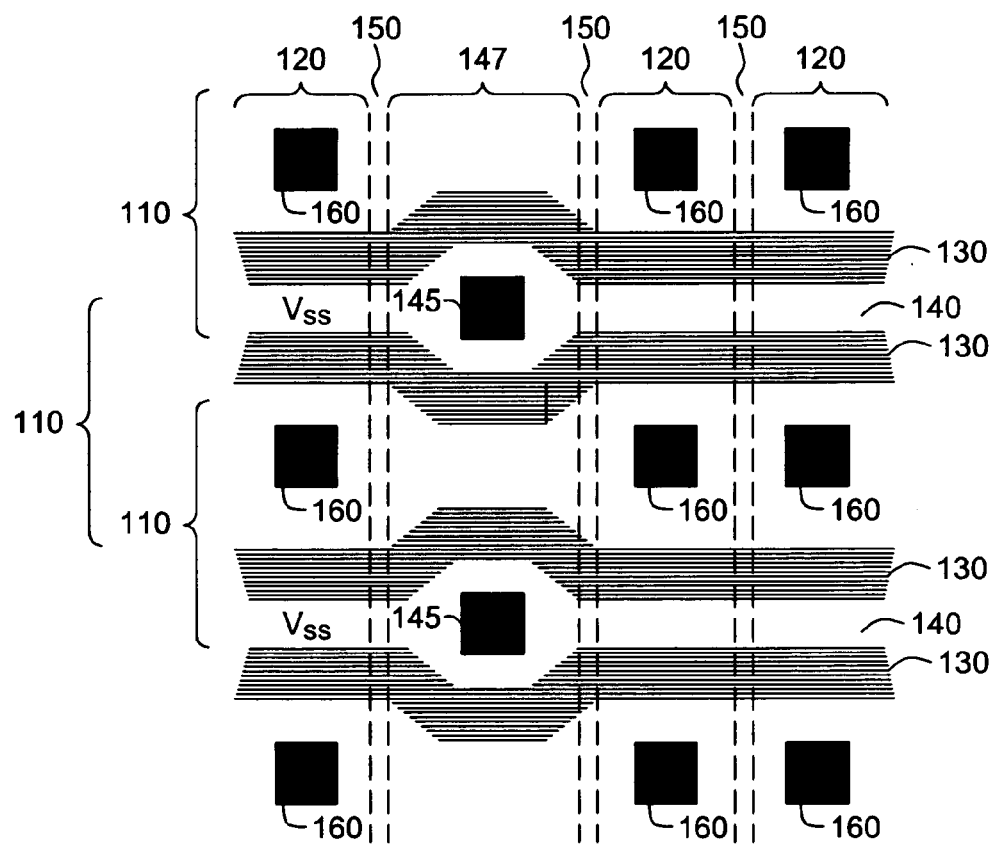
FIG. 1A is a planar view of a section of a core memory array of memory cells in a semiconductor memory.
Figure 1B:
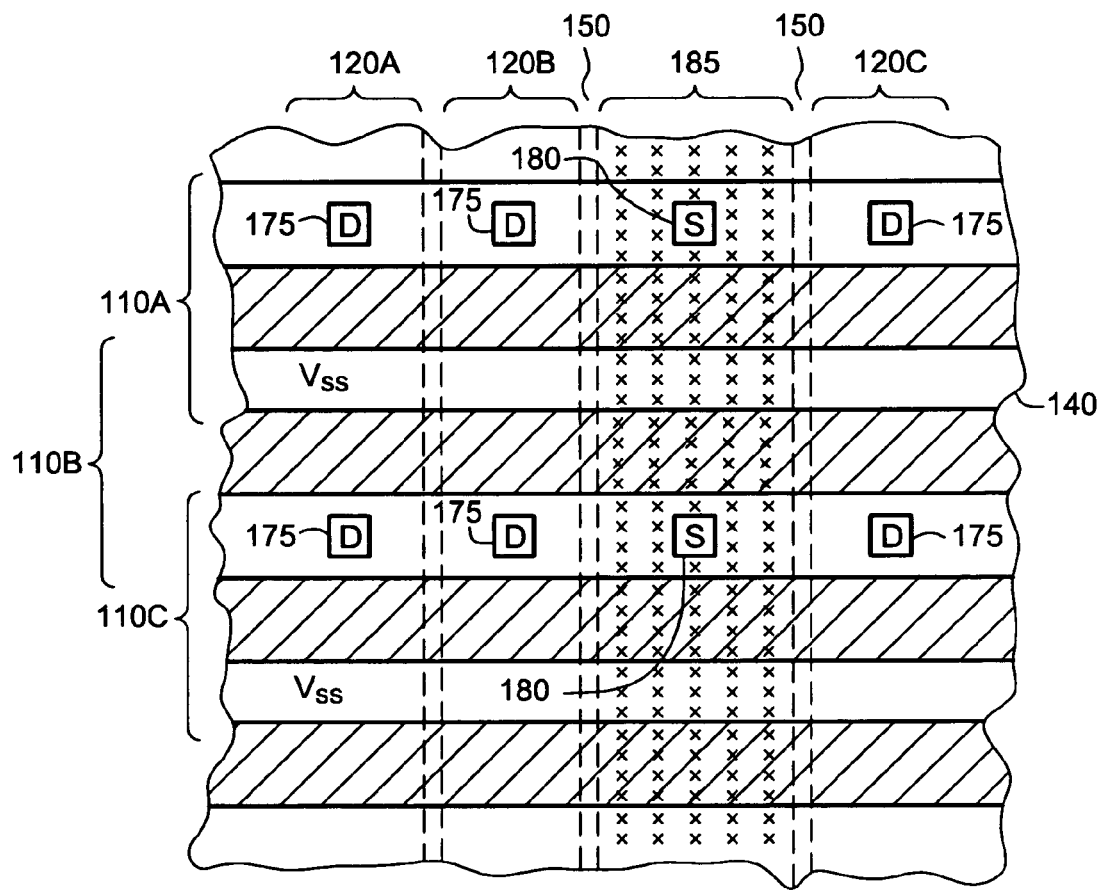
FIG. 1B is a planar view of a section of a core memory array of memory cells in a semiconductor memory.

Similarly, by forming a plurality of source contacts 280 in each of the plurality of rows of drain contacts 270, each of the plurality of word lines 240 that intersects the column containing source region implants 260 near one of the plurality of source contacts can maintain a uniform and straight formation in the fabrication process. In addition, by locating the plurality of source contacts in the plurality of drain contacts 270, each of the plurality of rows of memory cells 210 is smaller than each of the plurality of rows of memory cells 110 of Prior Art FIG. 1A. By locating the plurality of source contacts (e.g., 280 and 285) in the plurality of rows 270, the word lines do not require any bending.

Figure 1C:
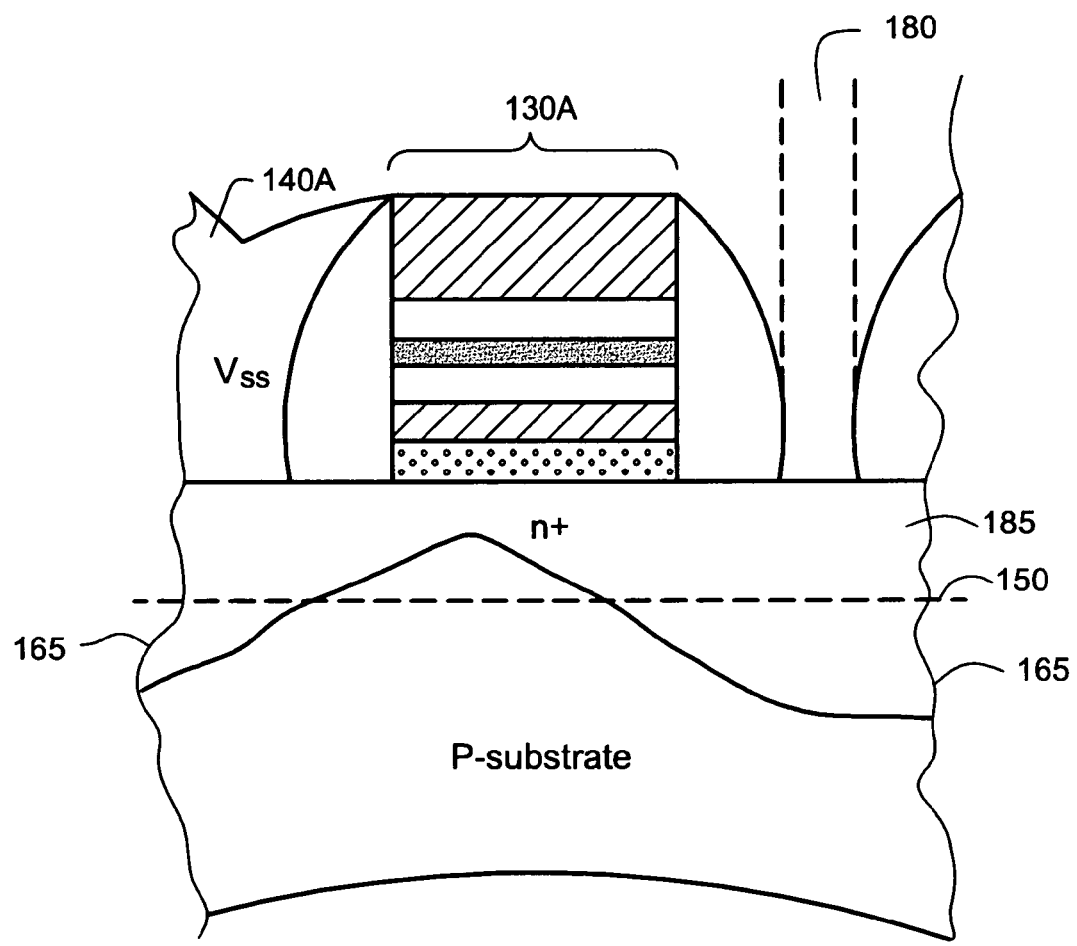
FIG. 1C is a cross-sectional view of a section of a core memory array of memory cells in a semiconductor memory.

Additionally, by implanting only the source side of the cells, the electrical coupling of drain contacts 280 to the source region implants 260 can remain shallower than the STI region and avoid the bit line "punch through" problem that is illustrated in Prior Art FIG. 1C.

In another embodiment, a second column (not shown) containing source regions that are isolated from drain regions in a columnar direction is also implanted with n-type dopants at the source regions and isolated between a second adjoining pair of the plurality of non-intersecting STI regions 250. The second column of source region implants is also coupled to the plurality of common source lines 240. In addition, source contacts are formed in the second column of source region implants similarly in the plurality of rows of drain contacts 270, as previously discussed. The second column of source region implants is located x columns of memory cells from the source column 260 as shown in FIG. 2 for reducing resistance in the plurality of common source lines. The number x can be any number, but typically is between 15 and 40.

Figure 3:
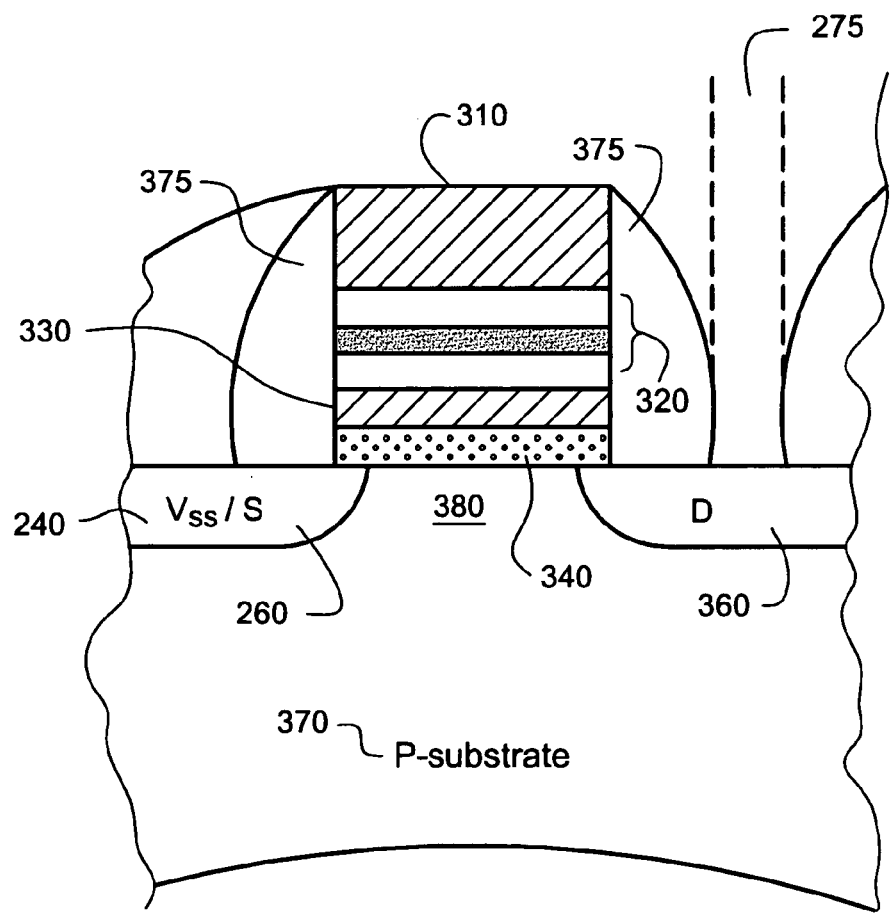
FIG. 3 is a cross-sectional view of the core memory array of memory cells of FIG. 2 taken along line 2A—2A illustrating an exemplary semiconductor flash memory cell, in accordance with one embodiment of the present invention.

FIG. 3 is a cross sectional diagram of the array of memory cells 200 taken along line 2A—2A of FIG. 2, in accordance with one embodiment of the present invention. FIG. 3 illustrates the formation of flash memory cell in one embodiment; however, other embodiments can include the formation of additional types of memory cells. FIG. 3 is a cross-sectional diagram of flash memory cell 300 including a tunnel oxide dielectric 340. The tunnel oxide dielectric 340 is sandwiched between a conducting polysilicon floating gate 330 and a crystalline silicon semiconductor substrate 370 (e.g., a p-substrate). The substrate 370 includes a source region 350 and a drain region 360 that can be separated by an underlying channel region 380. A control gate 310 is provided adjacent to the floating gate 330, and is separated by an interpoly dielectric 320. Typically, the interpoly dielectric 320 can be composed of an oxide-nitride-oxide (ONO) structure. In one embodiment, the control gate 310 forms the word line 230A of FIG. 2.

The flash memory cell 300 can be adapted to form a p-channel flash memory cell or an n-channel flash memory cell depending on user preference, in accordance with embodiments of the present invention. Embodiments of the present inventions are well suited to implementation within a p-channel or n-channel flash memory cell. Appropriate changes in the FIGS. 2–5 are necessary to reflect implementation of p-channel or n-channel devices.

FIG. 3 also illustrates optional sidewall spacers 375 formed on either side of the flash memory cell 300 for insulating the stacked gate formation of the flash memory cell 300. FIG. 3 also illustrates that common source line 240 is coupled to source region 350 of flash memory cell 300. Common source line 240 as shown in FIG. 3 is permanently connected to a source region implant 260). In addition, a drain contact 275, coupled to drain region 360, is one of an associated row of drain contacts (e.g., 270A of FIG. 2) in a row (e.g., row 210A of FIG. 2) of memory cells that includes flash memory cell 300.

Figure 4A:
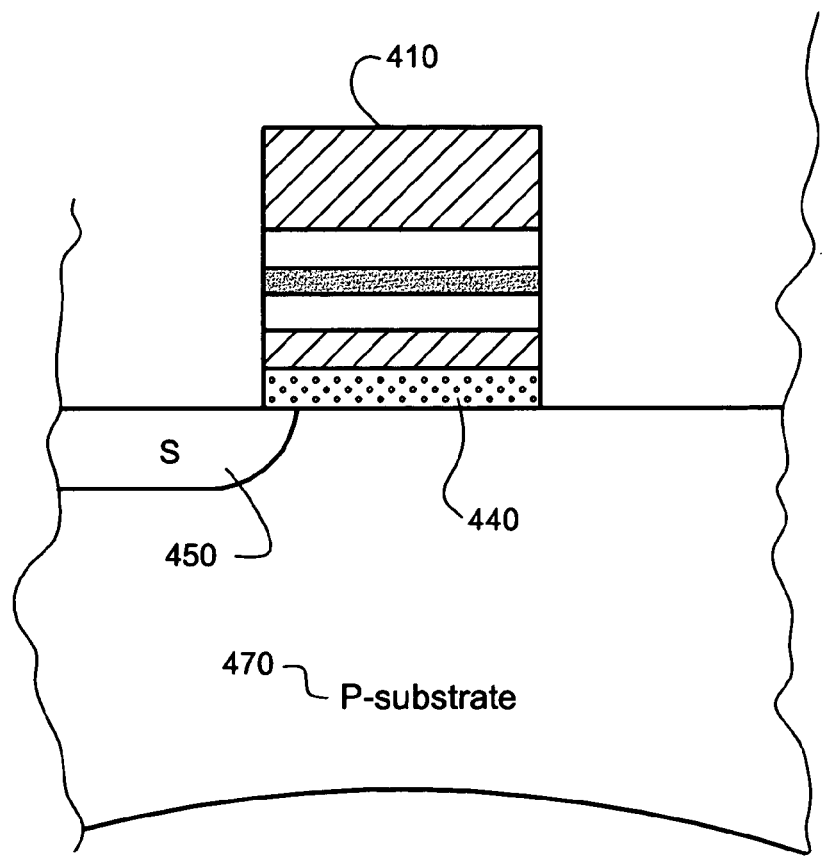
FIG. 4A is a cross sectional view of the core memory array of memory cells of FIG. 2 taken along line 2B—2B illustrating the source-side implantation of n-type dopants in the source side of a memory cell, in accordance with one embodiment of the present invention.
Figure 4B:
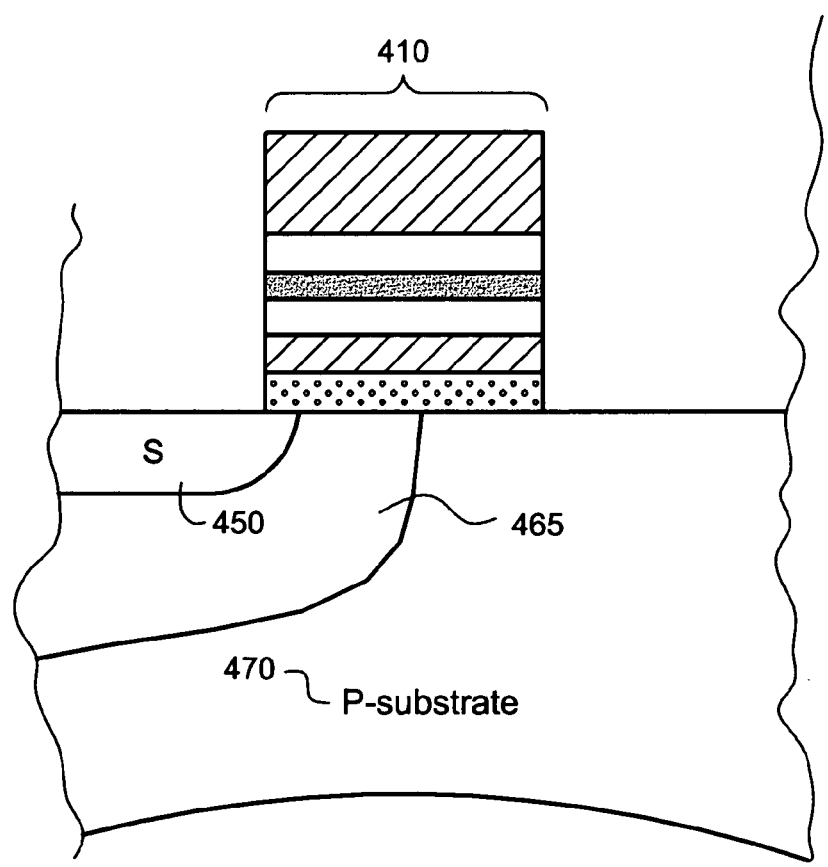
FIG. 4B is a cross-sectional view of the core memory array of memory cells of FIG. 2 taken along line 2B—2B illustrating the diffusion of source-side implanted n-type dopants following a thermal anneal cycle, in accordance with one embodiment of the present invention.
Figure 4C:
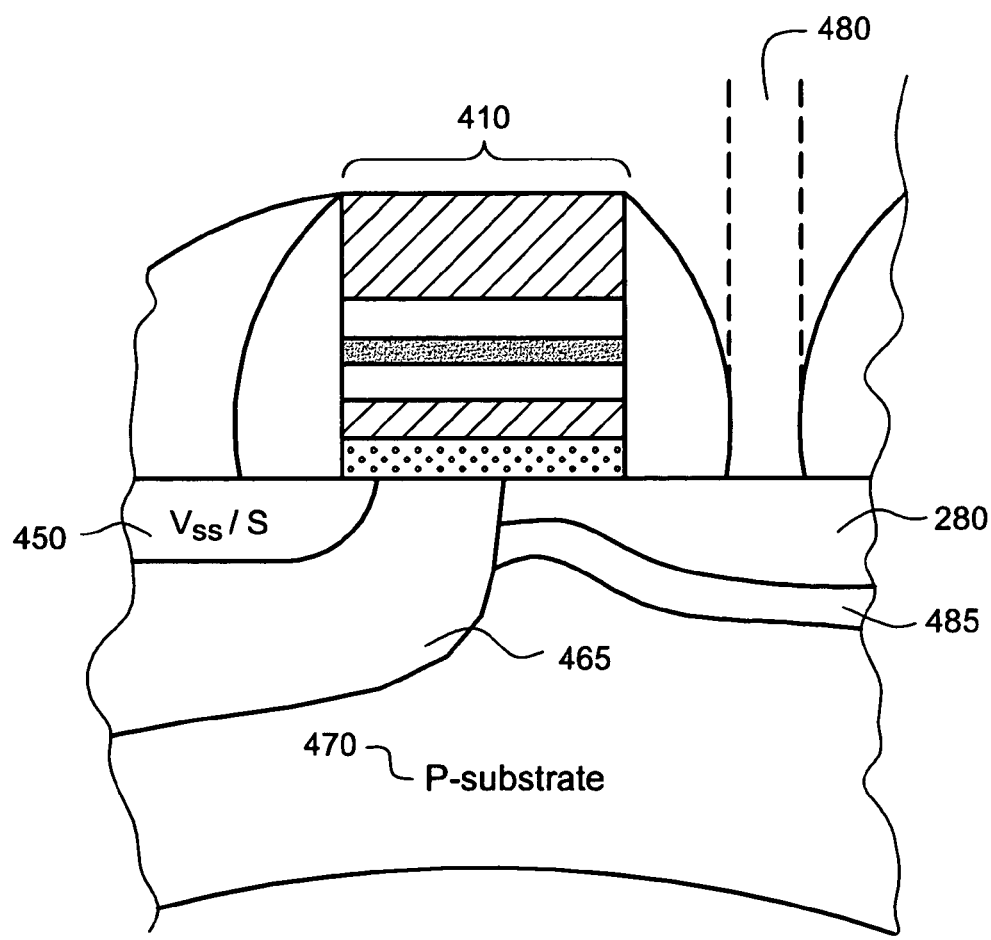
FIG. 4C is a cross-sectional view of the core memory array of memory cells of FIG. 2 taken along line 2B—2B illustrating the connection of a source contact located on the drain side to a source-side implant, in accordance with one embodiment of the present invention.

FIGS. 4A, 4B and 4C are cross sectional diagrams of one of the memory cells of the array 200, taken along line 2B—2B of FIG. 2, in accordance with one embodiment of the present invention. These figures illustrate three of the steps in the fabrication of the memory cells.

FIG. 4A illustrates the formation of a stacked gate structure 410 over the substrate 470 in a word line (e.g., 230C of FIG. 2) region aligning with the future location of source contacts (e.g., 280 of FIG. 2) and the source-side implantation 450 of n-type dopants in the source side of the stacked gate, in accordance with one embodiment of the present invention.

Additionally, it should be noted that even though FIG. 4A illustrates the formation of a complete stacked gate structure (e.g., including tunnel oxide, floating gate, ONO insulating layer, and control gate) that is formed in the fabrication process of the array 200, the stacked gate structure 410 in FIG. 4A is inactive, since there is no formation of isolated drain regions. Prior to implanting the drain region, a mask was applied to open the source line side, but not the drain side, so as to confine the implantation of n-type dopants to the source side only. Also, in other embodiments the stacked gate structure may or may not include all the components of the stacked gate structure as shown in FIG. 4A for various fabrication and performance reasons.

FIG. 4B is a cross-sectional view of the core memory array of memory cells as shown in FIG. 4A, in accordance with one embodiment of the present invention. Following the implanting of n-type dopants at source region 450, a thermal anneal cycle (thermal drive) is performed to diffuse (drive) the dopants further into the substrate and under stacked gate 410. The diffused region is indicated as region 465.

FIG. 4C is a cross-sectional view of the core memory array of memory cells as shown in FIGS. 4A and 4B, illustrating the connection of the source (Vss) line to the source region 450 and the subsequent electrical coupling 485 of the drain side implant 280 to the source region implant 450 and diffused source region 465. A source contact 480 is later formed with the drain side implant 280 that is now coupled to the source-region implant 450, in accordance with one embodiment of the present invention. The drain side connection 280/485 provides for electrical connection between the source contact 280 and the common source line 450.

By isolating the source side from the drain side and implanting only the source side with n-type dopants, the concern with deep lateral diffusion of the dopants that might migrate under the STI and impact the bit line is removed. If the dopants diffuse under the STI on the source side, there is no negative impact because that is the Vss side which is electrically connected to all the cells adjacent to it. Thus, by implanting only the source side and connecting it to the Vss, then implanting the electrical connection 280/485 from the source contact 480 residing on the drain side to the source region implant 450/465, the electrical connection implanted on the drain side may be kept sufficiently shallow as to avoid laterally diffusing under the STI and impacting the bit line.

Figure 5:
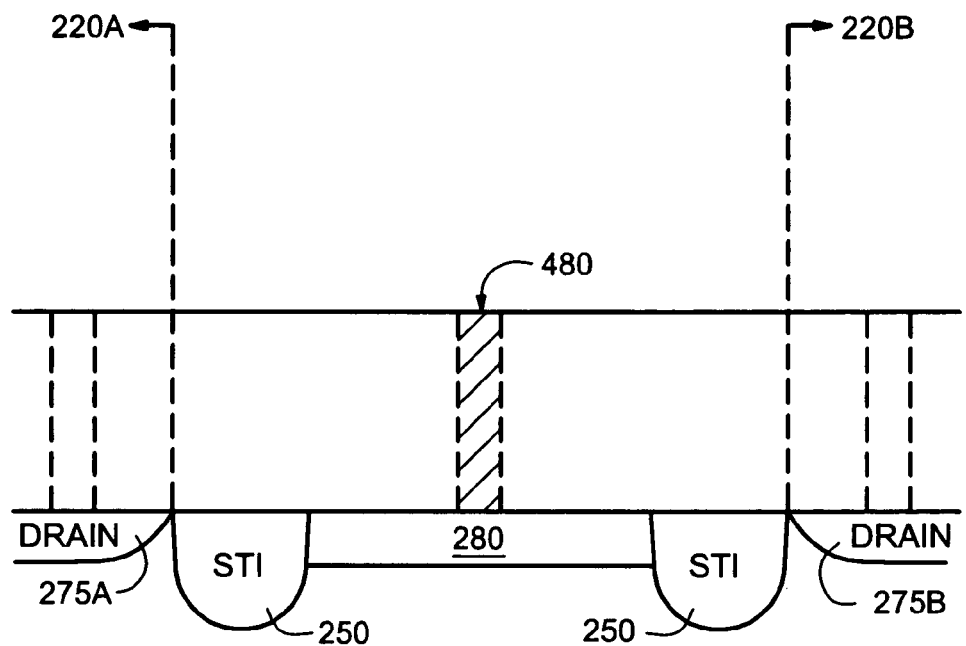
FIG. 5 is cross sectional view of the core memory array of memory cells of FIG. 2 taken along line 2C—2C illustrating the formation of the source contact along a row of drain contacts and the connection of the source contact to the source-side implant and (Vss) line, and illustrating avoidance of lateral diffusion under an STI region, in accordance with one embodiment of the present invention.

FIG. 5 is a cross sectional diagram of the array 200 of memory cells taken along line 2C—2C of FIG. 2, in accordance with one embodiment of the present invention. FIG. 5 illustrates the formation of a region 500 in the array 260 of memory cells that spans across three columns (column 220A, 220B and the column containing the source region implants 260A and 260B and source regions 280 and 285).

FIG. 5 illustrates the formation of a contact 480 to the source region 280 along the row of drain regions 275 in the associated row of memory cells (e.g., 210B of FIG. 2). In one embodiment, FIG. 5 illustrates that the source region 280 has a similar junction depth as the drain regions 275A and 275B.

In addition, STI regions of the pair 250 of STI regions isolate two columns (bit lines) of memory cells (220A and 220B). Drain regions 275A and 275B are shown of memory cells in the columns 220A and 220B, respectively, of memory cells. A column aligning with source region implants (e.g. 260A and 260B of FIG. 2) and source region 280 is shown isolated between the pair 250 of STI regions. The source region 280 remains, in the present embodiment, shallower than the STI regions 250 and, thus, isolated from the drain regions 275A and 275B along bit lines 220A and 220B, respectively.

Figure 6:
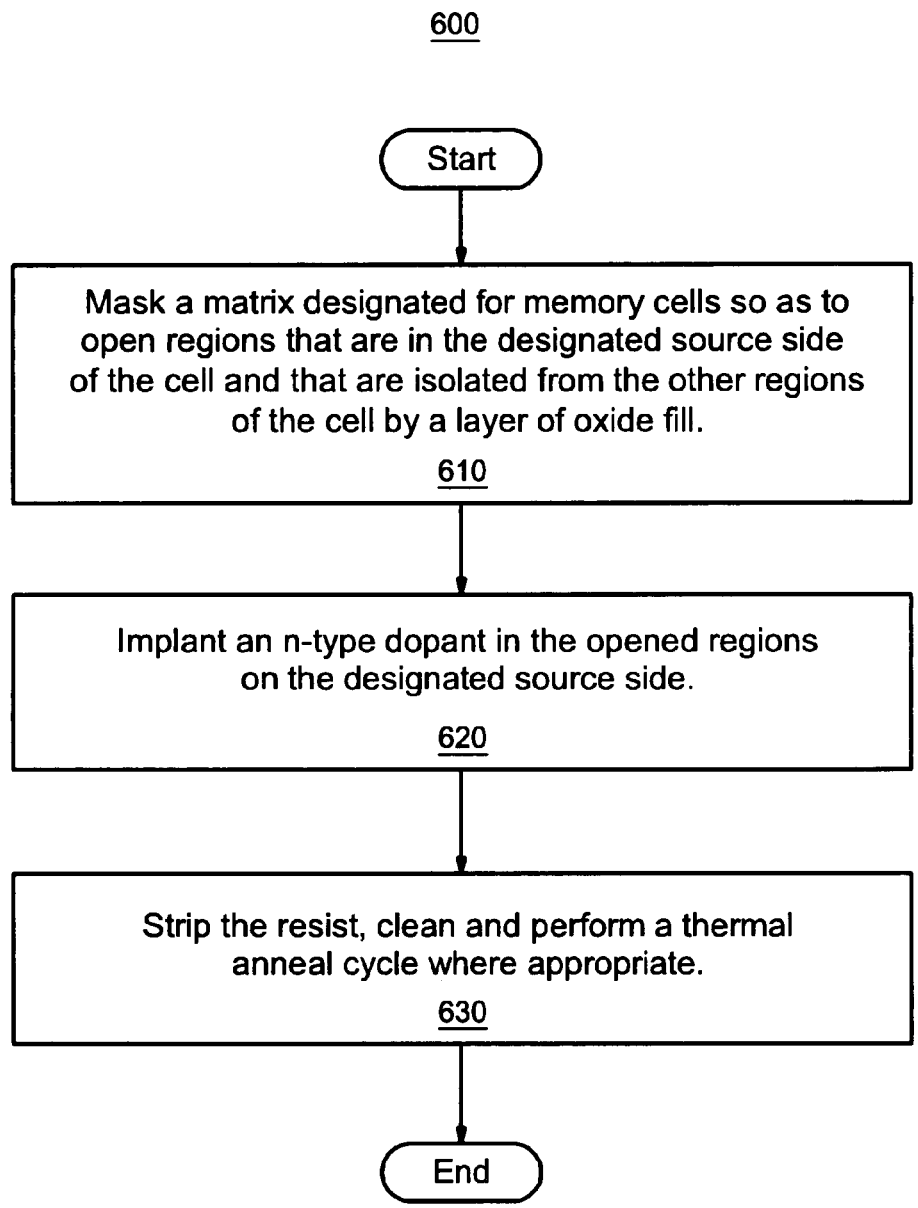
FIG. 6 is a flow chart of an overview of a method for eliminating word line bending and avoiding lateral diffusion and bit-line "punch through", in accordance with one embodiment of the present invention.

FIG. 6 is a flow chart of an overview of a method 600 for eliminating word line bending and avoiding lateral diffusion and bit-line "punch through", in accordance with one embodiment of the present invention. The present embodiment begins after the stack gates that are to form memory cells have been formed and oxide has been implanted on the substrate upon which the present embodiment is to be fabricated.

In step 610 of method 600, a matrix is masked to open regions (e.g., regions 260A and 260B of FIG. 2) in the designated source side of a memory cell. The matrix, designated for memory cells, is arranged in rows and columns and includes at least one row (e.g., row 270 of FIG. 2) for forming drain contacts that access drain regions in associated rows of the memory cells. The area around the opened regions are blocked by the prior filling with oxide.

At step 620, n-type dopants are implanted in the opened regions on the designated source side. By implanting only the region that lies on the source side, an electrical connection that is implanted on the drain side to avoid word line bending may be kept sufficiently shallow as to avoid laterally diffusing under the STI and impacting the bit line.

At step 630 of method 600, a photoresist layer is stripped, the matrix is cleaned and a thermal anneal cycle is performed, if appropriate. The thermal anneal process functions to diffuse or drive the n-type dopants of the source region implant under the word lines in order to create a better area for coupling the source contacts to the source (Vss) lines. As critical dimensions of memory cells become smaller, it may no longer be necessary to perform this extra thermal anneal cycle since other subsequent thermal anneals in a conventional process flow would be sufficient.

Following step 630, a conventional sequence of manufacturing a matrix of memory cells follows, including the forming of Vss and drain implants and coupling the source contacts (now located within the row of drain contacts) to the source region implants and connecting drain contacts to the drain region implants. By locating the source contacts in associated rows of drain contacts, the word lines do not need to bend around source contacts that are larger than the source line.

Figure 7:
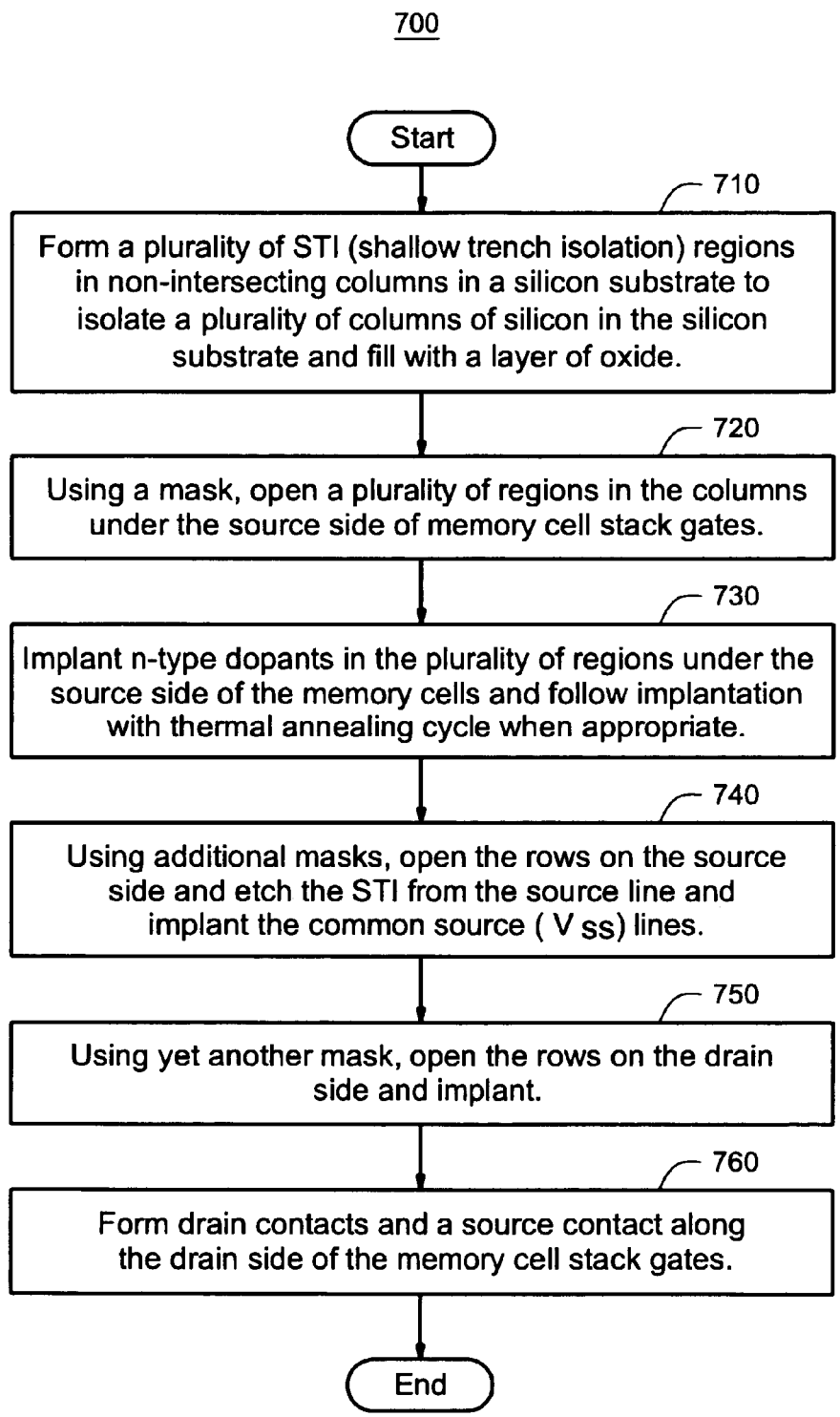
FIG. 7 is a flow chart illustrating steps in a method for the fabrication of source regions in a core array of memory cells with source line connections that facilitate straight word lines and avoid bit-line "punch through", in accordance with one embodiment of the present invention.

FIGS. 7 and 8A–E illustrate the fabrication steps implemented in a method 700 for forming a source line contact in an array of memory cells that does not require any word line bending, in accordance with one embodiment of the present invention. FIG. 4C is also referenced FIG. 7 is a flow chart of steps in a method 700 for forming the source line contact in an array of memory cells that does not require any word line bending. FIGS. 8A–E are diagrams illustrating the fabrication steps implemented to form the source line contact as disclosed in flow chart 700.

Figure 8A:
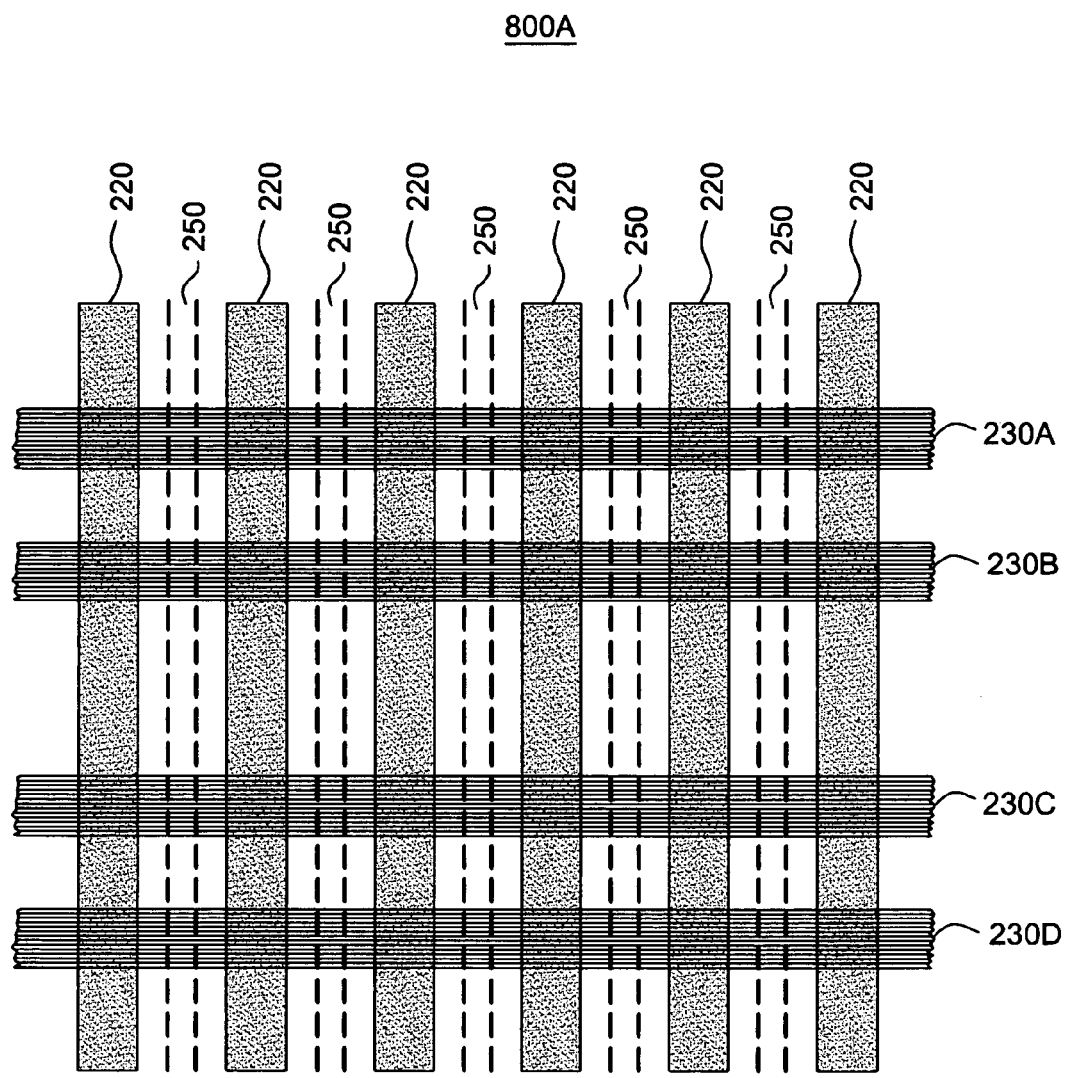
FIGS. 8A–8E are diagrams illustrating the fabrication steps as outlined in FIG. 7 for the fabrication of source regions in a core array of memory cells with source line connections that facilitate straight word lines and avoid bit-line "punch through", in accordance with one embodiment of the present invention.

Referring now to step 710 of FIG. 7 and FIG. 8A, the present embodiment begins by forming a plurality of STI regions 250 in non-intersecting columns in a silicon substrate 800a. The STI regions 250 are formed between columns that form bit lines 220. STI regions 250 run perpendicular with word lines 230A–230D. The plurality of STI regions isolates a plurality of columns in the silicon substrate into which a layer of oxide is filled.

Figure 8B:
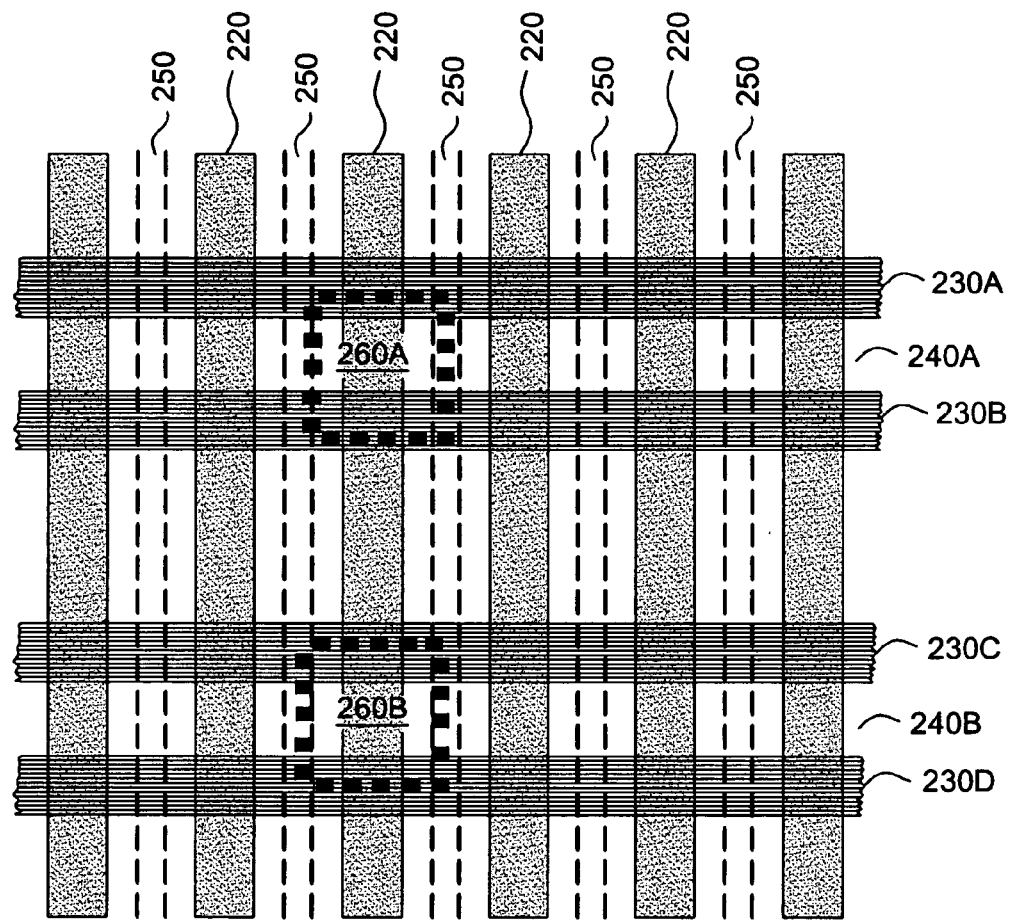

At step 720 of flow chart 700 and referring to FIG. 8B, a mask is used to open a plurality of regions (e.g., 260A and 260B) in the source side 240 of matrix 800b to allow implantation.

Flow chart 700 then proceeds to step 730, where the present embodiment implants n-type dopants in the plurality of regions in the source side to form a plurality of source region implants 260A and 260B. Following the n-type implanting, a photoresist layer used in the masking process is stripped away, the matrix is cleaned, and a thermal anneal process may be performed if appropriate. The thermal anneal process functions to diffuse or drive the n-type dopants of the source region implant under the word lines in order to create a better area for coupling the source contacts to the source (Vss) lines. As the critical dimensions of the memory cells become smaller, the need to thermally drive the implant under the word lines may become obsolete.

After implantation of the n-type dopants in the source regions 260A and 260B and removal of the photoresist layer, the remaining fabrication steps for forming a typical core memory array can be followed. As such, the formation of the source region implants only requires the additional steps of source and Vss connection and drain side implants, as implemented in current fabrication techniques.

Figure 8C:
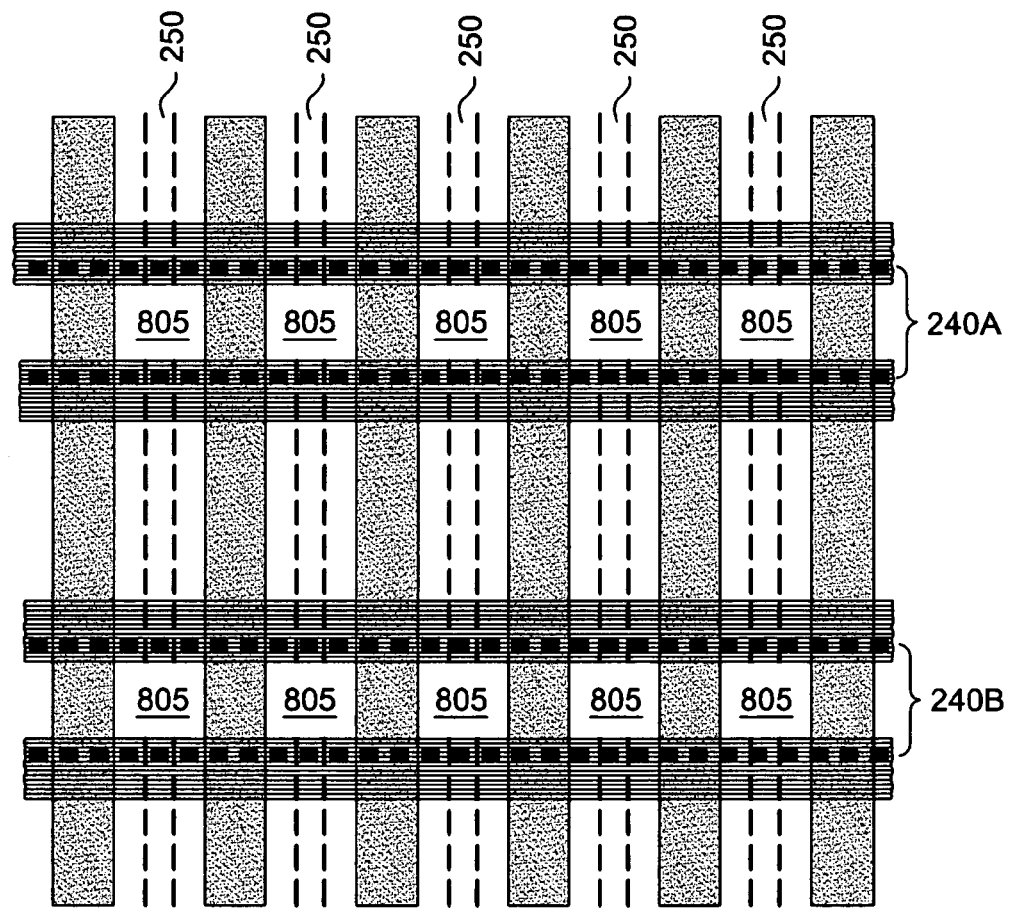
Figure 8D:
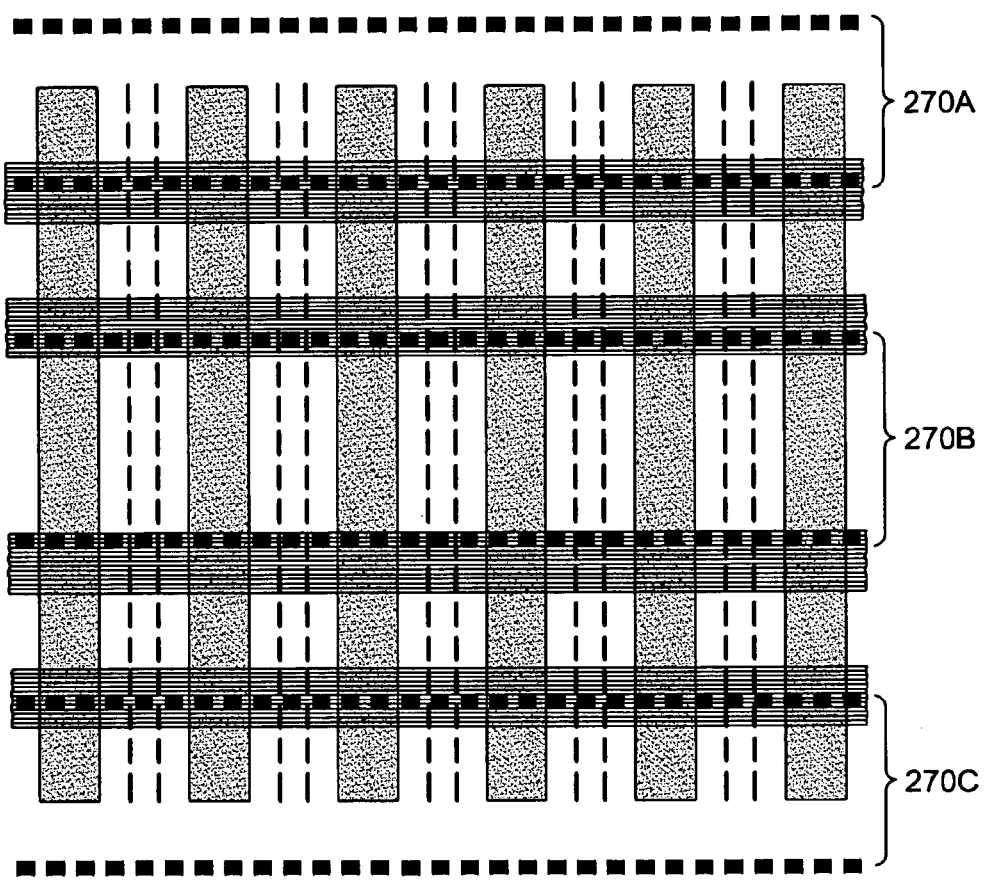
Figure 8E:
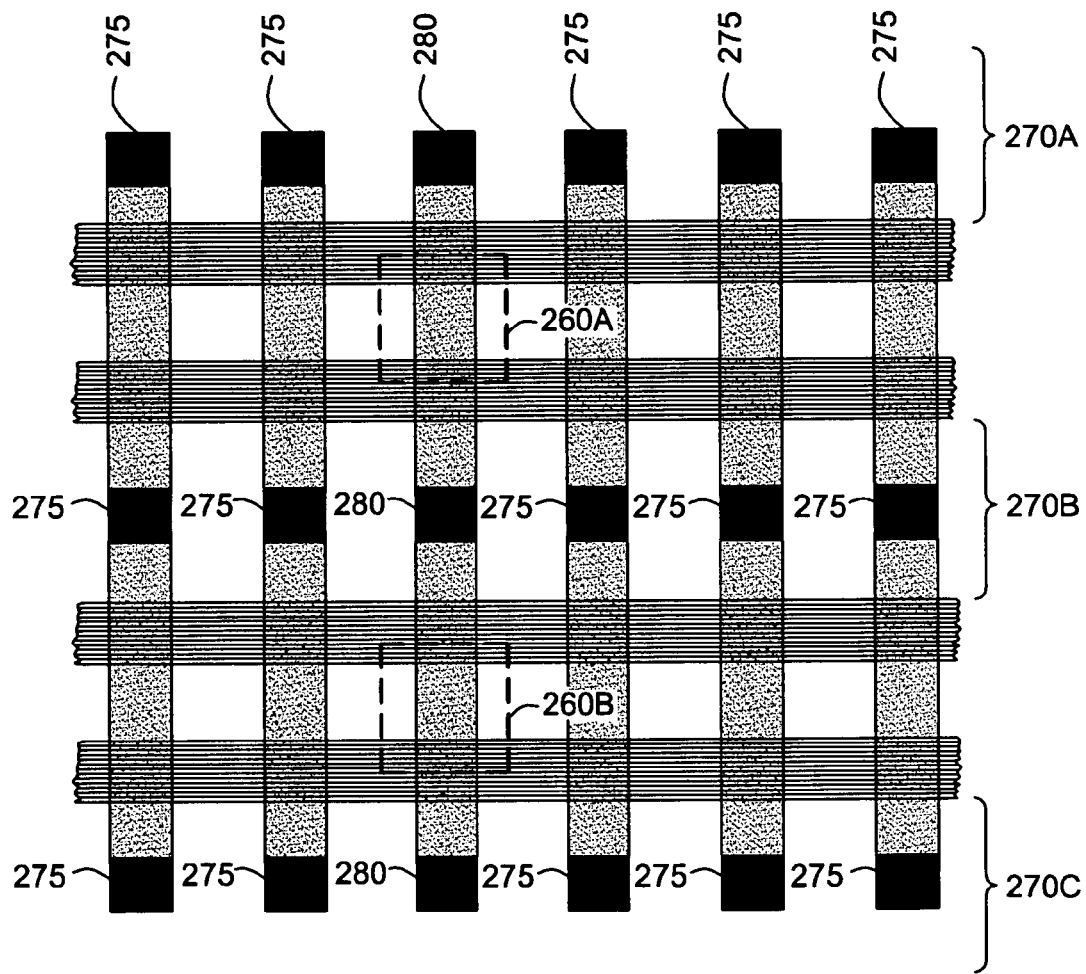

FIGS. 8C–8E illustrate the remaining fabrication steps for the formation of the array of memory cells. In FIG. 8C, according to step 740 of method 700, a mask, such as self-align source etch masks, may be used to open up rows where common source and Vss lines 240A and 240B are to be implanted. The STI is then etched from regions 805. Next, using the same mask or another of the same mask, the source and Vss lines 240A and 240B are implanted. Refer to FIG. 4C for a cross-section showing the implanted source lines 450 and Vss 240A. As per typical procedures, the implantation the photoresist is stripped and the wafer is cleaned.

Although the present embodiment discloses the formation of the source region implants immediately after the formation of the STI regions and the oxide fill at the beginning of the fabrication process, other embodiments are well suited to the formation of the source region implants at other stages of the fabrication process.

In step 750, as shown in FIG. 8D, method 700 uses another mask to open rows 270A–270C on the drain side of the memory cells and implants the drain (e.g., drain 480 of FIG. 4C). Next, as per typical procedure, the photoresist is stripped away and the wafer is cleaned.

In step 760 and FIG. 8E, a source contacts 280 are formed along with a row of drain contacts 275 along rows 270A–270C and the source contacts 280 are coupled (e.g., coupling 480 in FIG. 4C) to at least one of the source region implants 260A and 260B (e.g., source region implant 465 of FIG. 4C). The source contacts 280 are formed simultaneously and in line drain contacts 275. Thus, the word lines need not be altered or bent to accommodate for the formation of source contacts (e.g., when forming source contacts in-line with the common source line). Also, by forming the source contact on the source side only, the possibility of lateral diffusion of the source region implant and bit-line punch through is substantially reduced.

The preferred embodiments of the present invention, a semiconductor structure including a core memory array of memory cells with source line connections that eliminate word line bending by source side implantation, and a method for producing the same, is thus described. While the present invention has been described in particular embodiments, it should be appreciated that the present invention should not be construed as limited by such embodiments, but rather construed according to the below claims.

What is claimed is:

1. A method of forming a source line contact in a non-volatile memory comprising:

masking a column in a matrix of memory cells, said column perpendicular to said source line and aligned with a plurality of source contact regions and said masking allowing for an implant of n-type dopants only in a region on a source side of said memory cells;

forming a plurality of source implants in said regions on the source side of said memory cells, said memory cells arranged in a matrix of rows and columns, said matrix including at least one row of drain contacts for accessing drain regions in associated rows of memory cells in said matrix of memory cells;

coupling said plurality of source implants to a plurality of source lines that are perpendicular to said column of source implants, for providing electrical coupling of said plurality of said source lines to said plurality of source implants; and further coupling a plurality of source contacts to said plurality of source implants, each of said plurality of source contacts located in-line with an associated row of drain contacts.

2. The method as recited in claim 1, further comprising:

forming a plurality of word lines in said array of memory cells perpendicular to said column of source implants, wherein each of said plurality of word lines comprises a straight word line.

3. The method as recited in claim 1, further comprising:

annealing said columns of n-doped source implants thermally to partially drive diffusion of said n-type dopants under said word lines in said matrix of memory cells.

4. The method as recited in claim 3, further comprising:

implanting said n-type dopants after formation of a plurality of STI columns, said plurality of STI columns isolating columns of memory cells and said masking isolating said source side regions in said matrix of memory cells.

5. The method as recited in claim 3, wherein implanting said n-type dopants is performed after said forming said plurality of word lines.

6. The method as recited in claim 1, wherein at least one memory cell of said matrix of memory cells comprises a flash memory cell.

7. The method as recited in claim 1, further comprising:

arranging said matrix of memory cells in a NOR type configuration.

8. The method as recited in claim 1, wherein each of said plurality of source lines comprises a common source line.

9. A method of forming a source line contact in an array of memory cells comprising:

forming a plurality of shallow trench isolation (STI) regions in non-intersecting columns in a silicon substrate, said plurality of STI regions isolating a plurality of columns of silicon in said silicon substrate;

masking said columns of silicon to isolate a plurality of regions under a source side of said memory cells from a plurality of regions in said columns of silicon under a drain side of said memory cells;

implanting n-type dopants in said plurality of regions under said source side of said memory cells to form a plurality of source region implants;

forming a plurality of common source lines across said array of memory cells, said plurality of common source lines perpendicular to said columns of silicon as the location of said source region implants;

coupling said plurality of common source lines to said source region implants in said array of memory cells; and forming a source contact along a row of drain contacts associated with a row of memory cells perpendicular to said silicon column containing said source region implants, said source contact coupled to at least one of said source region implants.

10. The method as recited in claim 9, further comprising:

forming a plurality of tunnel oxide layers on a semiconductor substrate between respective source and drain regions;

forming a plurality of floating gates formed on said plurality of tunnel oxide layers;

forming a plurality of interpoly dielectric layers on said plurality of floating gate layers; and forming a plurality of control gates on said plurality of interpoly dielectric layers.

11. The method as recited in claim 10, further comprising:

annealing said structure thermally to drive said n-type dopants partially under adjacent gate layers of said memory cells, said annealing preceding said forming said plurality of a common source lines.

12. The method as recited in claim 9, further comprising:

forming a plurality of word lines that are non-intersecting across said array of memory cells, said plurality of word lines coupled to a plurality of control gates in said array of memory cells, said plurality of word lines exhibiting straightness with a column that aligns with said source regions and adjacent to said source contact.

* * * * *